(12) United States Patent
Grivna et al.

(10) Patent No.: US 9,773,693 B2
(45) Date of Patent: Sep. 26, 2017

(54) METHOD OF FORMING A SEMICONDUCTOR DEVICE INCLUDING TRENCH TERMINATION

(71) Applicant: SEMICONDUCTOR COMPONENTS INDUSTRIES, LLC, Phoenix, AZ (US)

(72) Inventors: Gordon M. Grivna, Mesa, AZ (US); Zia Hossain, Tempe, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/047,874

(22) Filed: Feb. 19, 2016

(65) Prior Publication Data

US 2016/0172234 A1    Jun. 16, 2016

Related U.S. Application Data

(62) Division of application No. 14/297,204, filed on Jun. 5, 2014, now Pat. No. 9,299,776.

(Continued)

(51) Int. Cl.
*H01L 21/762* (2006.01)
*H01L 29/06* (2006.01)
(Continued)

(52) U.S. Cl.
CPC .. *H01L 21/76205* (2013.01); *H01L 21/76816* (2013.01); *H01L 29/0615* (2013.01);
(Continued)

(58) Field of Classification Search
CPC ......... H01L 21/76205; H01L 21/76816; H01L 29/0615; H01L 29/0649; H01L 29/407;
(Continued)

(56) References Cited

U.S. PATENT DOCUMENTS 7,345,342 B2    3/2008   Challa et al.
8,034,685 B1 *  10/2011  Venkatraman ........ H01L 29/407
                                              438/270

(Continued)

OTHER PUBLICATIONS

Bhavani Burra et al., "Process & Design Impact on BVDss and UIS Stability of Shielded Gate Tranch Power MOSFETs," ON Semiconductor, Mar. 17, 2014, 3 pages.

*Primary Examiner* — Moazzam Hossain
*Assistant Examiner* — Farun Lu
(74) *Attorney, Agent, or Firm* — Robert F. Hightower

(57) ABSTRACT

In an embodiment, a method of forming a semiconductor may include forming a plurality of active trenches and forming a termination trench substantially surrounding an outer periphery of the plurality of active trenches. The method may also include forming at least one active trench of the plurality of active trenches having corners linking trench ends to sides of active trenches wherein each active trench of the plurality of active trenches has a first profile along the first length and a second profile at or near the trench ends; and forming a termination trench substantially surrounding an outer periphery of the plurality of active trenches and having a second profile wherein one of the first profile or the second profile includes a non-linear shape.

15 Claims, 11 Drawing Sheets

Related U.S. Application Data

(60) Provisional application No. 61/893,882, filed on Oct. 21, 2013, provisional application No. 61/917,908, filed on Dec. 18, 2013.

(51) Int. Cl.
  *H01L 21/768* (2006.01)
  *H01L 29/78* (2006.01)
  *H01L 29/40* (2006.01)
  *H01L 29/66* (2006.01)

(52) U.S. Cl.
  CPC ........ *H01L 29/0649* (2013.01); *H01L 29/407* (2013.01); *H01L 29/66734* (2013.01); *H01L 29/7811* (2013.01); *H01L 29/7813* (2013.01)

(58) Field of Classification Search
  CPC ........... H01L 29/66734; H01L 29/7811; H01L 29/7813
  See application file for complete search history.

(56) References Cited

U.S. PATENT DOCUMENTS

| | | |
|---|---|---|
| 2004/0113201 A1 | 6/2004 | Bhalla et al. |
| 2005/0167742 A1* | 8/2005 | Challa ................ H01L 21/3065 257/328 |

* cited by examiner

| Finished Wafer | Substrate Type | 1st Epitaxial Layer (bottom) | | | 2nd Epitaxial Layer (top) | | |
|---|---|---|---|---|---|---|---|
| | | Dopant | Center Pt. Resistivity | Center Pt. Thickness | Dopant | Center Pt. Resistivity | Center Pt. Thickness |
| | | Bottom | | | Top | | |
| | | Dopant | Conc cm$^{-3}$ | μm | Dopant | Conc cm$^{-3}$ | μm |
| Epi1 | Phos | Phos | C1 | T1 | Phos | C2 | T2 |
| Epi2 | Phos | Phos | C1+22% | T1 | Phos | C2 | T2 |

METHOD OF FORMING A SEMICONDUCTOR DEVICE INCLUDING TRENCH TERMINATION

The present application is a divisional application of prior U.S. application Ser. No. 14/297,204, filed on Jun. 5, 2014, which is hereby incorporated herein by reference, and priority thereto for common subject matter is hereby claimed.

PRIORITY CLAIM TO PRIOR PROVISIONAL FILING

This application claims priority to prior filed Provisional Application No. 61/893,882 entitled "METHOD OF FORMING A SEMICONDUCTOR DEVICE INCLUDING TRENCH TERMINATION AND TRENCH STRUCTURE THEREFOR" filed on Oct. 21, 2013, having common inventors Hossain et al., which is hereby incorporated herein by reference; and claims priority to prior filed Provisional Application No. 61/917,908 entitled "METHOD OF FORMING A SEMICONDUCTOR DEVICE INCLUDING TRENCH TERMINATION AND TRENCH STRUCTURE THEREFOR" filed on Dec. 18, 2013, and having common inventors Hossain et al., which is hereby incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form metal oxide semiconductor (MOS) field effect transistors (FETs). Breakdown voltage (BVdss) was one characteristic that often was important for such transistors. Elements that may affect the stability of such devices could provide improvements in design and process parameters in order to produce a robust product. Some embodiments of the transistors used a trench termination structure and a shield plate structure to improve the breakdown voltage characteristics. The trench termination structure typically surrounded a periphery of the device, and the shield plate structure was underlying the active regions of the device. However, in some designs the breakdown voltage, such as for example BVDss, was lower than desired.

Accordingly, it is desirable to have a method of forming an MOS device and/or an MOS device structure that improves the breakdown voltage.

Figures 1, 2:
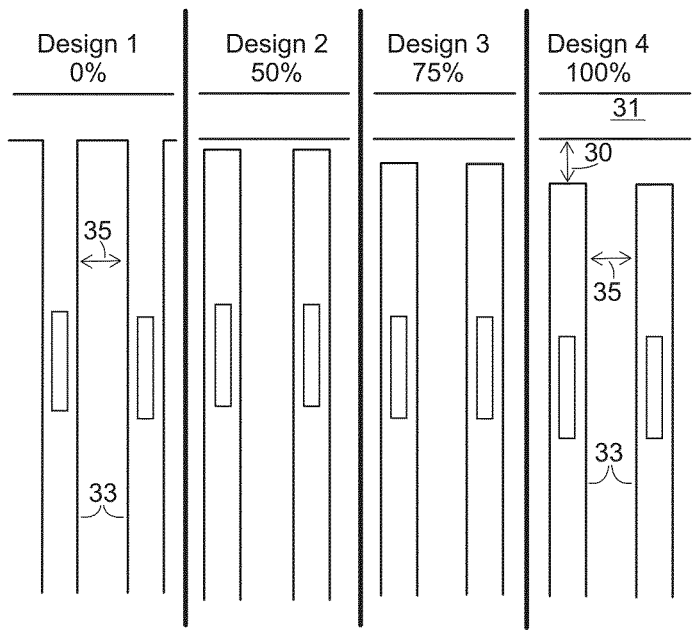
FIG. 1 illustrates some examples of trench end spacing (TES) design conditions for four different example embodiments of MOSFETs having trench termination.
FIG. 2 is a table illustrating some examples of certain process parameters that may be applicable to the transistors illustrated in FIG. 1.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements are omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description may illustrate a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

FIG. 1 illustrates some examples of trench end spacing (TES) design conditions for four different example embodiments of MOSFETs having trench termination. The four different embodiments are labeled as Design1 through Design4 and all four illustrate different spacing between a termination trench 31 and an end of an active trench 33. The spacing is referred to as a trench end spacing (TES) 30. Design1 illustrates a trench end spacing (TES) 30 that is approximately zero, Design2 illustrates a TES 30 that is approximately fifty percent (50%) of a spacing 35 between the sides of adjacent active trenches 33, Design3 illustrates a TES of seventy five percent (75%) of spacing 35, and Design4 illustrates a TES of approximately one hundred (100%) of spacing 35. It is believed that the breakdown voltage may be affected by the trench end spacing.

In some embodiments, the portion of the MOSFET between trenches 33 may be referred to as a portion of a drift region of the device. The portion between trench 31 and the ends of trenches 33 may also be included as a portion of the drift region. In some cases, the transistors exhibited a low breakdown voltage or in some cases a characteristic often referred to as BVdss walk. Such terms usually refer to changes in BVDss, for example walk-out may mean an increase in BVDss and walk-in may mean a decrease in BVDss.

FIG. 2 is a table illustrating some examples of certain process parameters that may be applicable to the transistors illustrated in FIG. 1.

Figure 3:
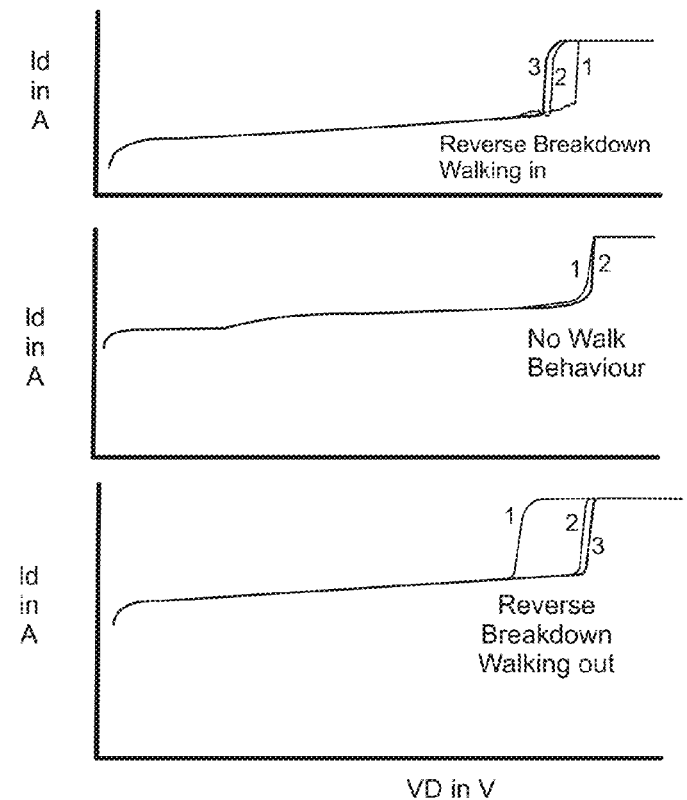
FIG. 3 is a graph having plots that illustrate examples of some parameters of the transistors illustrated in FIG. 1.
Figure 4:
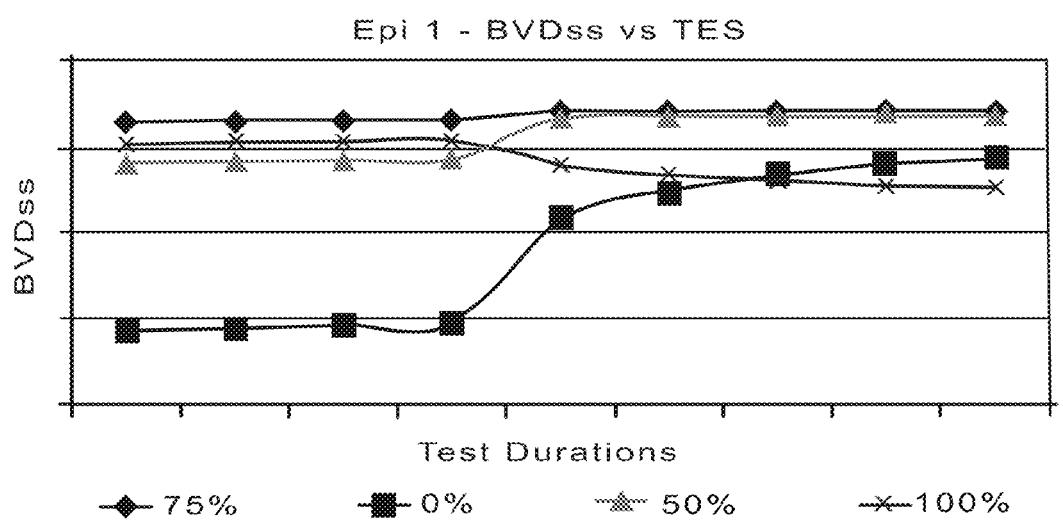
FIG. 4 is a graph having plots that illustrates examples of BVDss characteristics of the transistors illustrated in FIG. 1.
Figure 5:
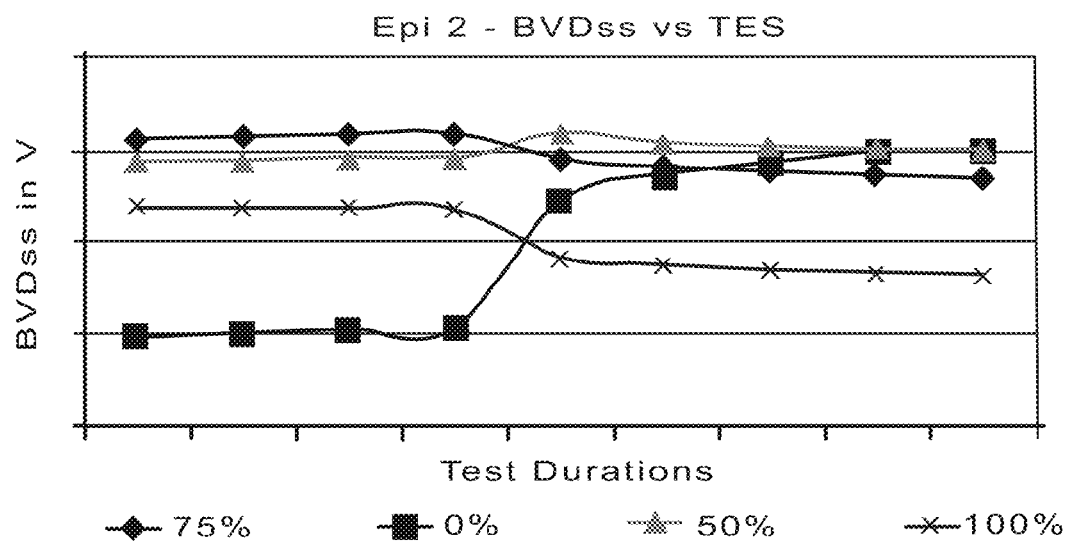
FIG. 5 is a graph having plots that illustrates examples of other characteristics of the transistors illustrated in FIG. 1.

BVDss test(s) may be performed by forcing drain current and measuring drain-source voltage drop while gate and shield plates are kept at ground potential. In one example test, a drain current of approximately two hundred fifty micro-amperes (250 uA) was used. To illustrate walk behavior, BVDss may be measured during different lengths of test times (for example 5 ms and 1 s pulses). FIG. 3 is a graph having plots that illustrate examples of walk (for example walk-in and/or walk-out) behavior for different examples of transistor embodiments. In the example case of Design1 (FIG. 1) that used Epi1 from the table of FIG. 2, Design1 showed the highest increase in BVDss (walk-out). Design3 (TES=75%) showed a more stable breakdown over different test times. Results of this are illustrated in the plots illustrated in the graph of FIG. 3. FIG. 4 is a graph having plots that illustrates examples of BVDss variations with test time durations for different design configurations on Epi1 (FIG. 2). FIG. 5 is a graph having plots that illustrates examples of BVDss variations with test time durations for different design configurations on Epi2 (FIG. 2).

Figure 6:
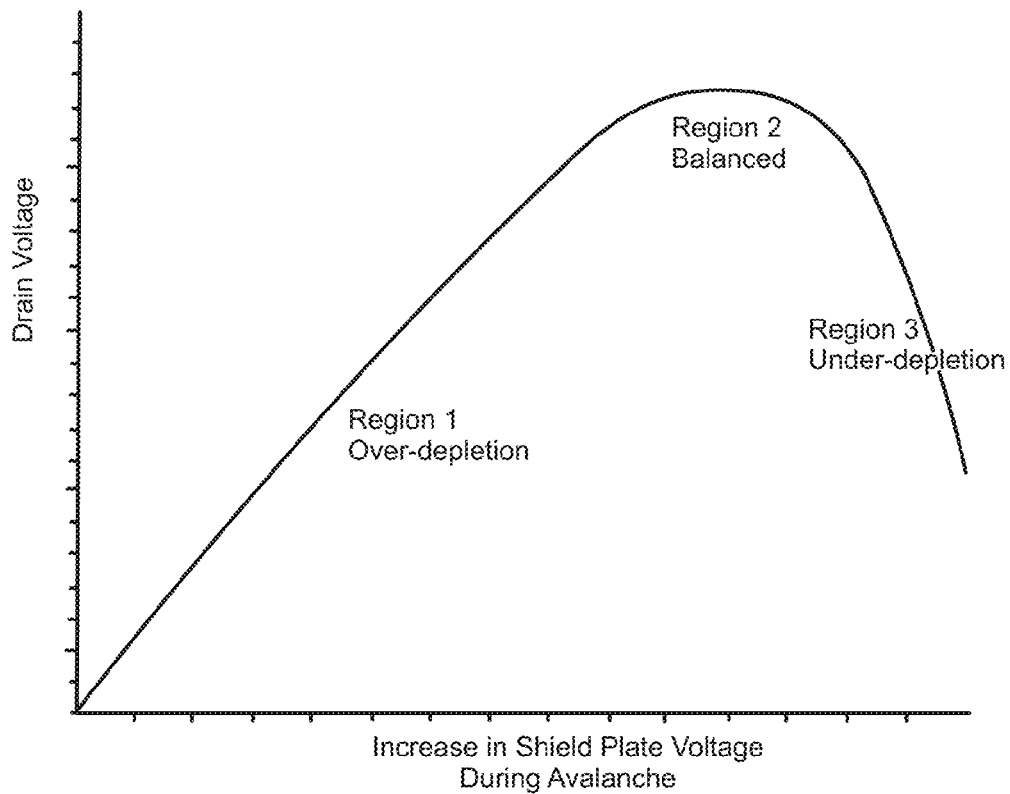
FIG. 6 is a graph illustrating shield plate voltage verses drain voltage for some of the embodiments illustrated in FIG. 1.

It is believed in this case that excess (Design1) or improved (Design3) shield effect may be present to deplete a finite amount of space charge. Design1 has more shield plate depleting and less amount of silicon at trench ends when compared to other designs; it is believed that this may imply Design1 is operating in over-depletion. FIG. 6 is a graph illustrating shield plate voltage verses drain voltage for some of the embodiments illustrated in FIG. 1. A device designed to operate in over-depletion (Region 1) may have BVDss increase (walk-out) with test time as increasing shield potential compensates the over-depletion effect, thus possibly moving the device towards equilibrium (for example region2 of FIG. 6). When the trench end spacing (TES) is greater than zero (such as illustrated in Design2-4 of FIG. 1) more space charge may be available to deplete than in the case of Design1. For the case of Design3 with Epi1, the device may have increased charge balance and hence less walk behavior may be seen than for Design1.

In case of Epi2 (FIG. 2, higher doping concentration), improved BVDss behavior may be achieved with Design2, less spacing than is used in Epi1 (FIG. 2). The improved BVDss may be due to higher availability of space charge per shield effect.

Design4 (for Epi1 and Epi2) may be operating in under-depletion mode (region3 of FIG. 6). For example the silicon containing space charge, such as for example in the drift region, may be in excess of the E-field coming from the shield plates. BVDss drops further (walk-in) with increasingly shield potential and the device is pushed deeper into under-depletion mode.

Figure 7:
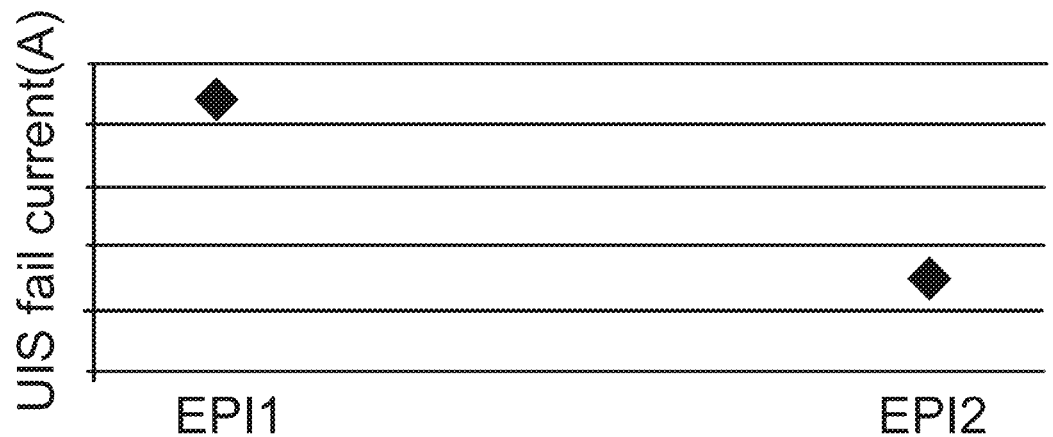
FIG. 7 illustrates UIS example values for the Epi1 and Epi2 examples the transistors illustrated in FIG. 1.

One measure of robustness may be related to a device's capability to withstand surge currents without causing permanent damage. Surge current testing may be used to determine the Unclamped Inductive Switching (UIS) characteristics of the transistor. In one embodiment, Epi1 with lower epi concentration showed improved performance compared to Epi2. This may indicate that a trade-off between specific-Rdson and UIS capability may be used to produce a more robust device. In some embodiments, UIS capability may be independent of TES. FIG. 7 illustrates UIS example values for the Epi1 and Epi2 examples of FIG. 2.

Those skilled in the art will understand that in one embodiment, a shielded-gate trench FET may be a charge balanced structure where drift region charge is balanced or at least off-set by the depletion from the neighboring trench shield-plates. It is believed that it may be more difficult to balance the charge in the drift region between the termination trench and the ends of the active trenches than it is to provide a balanced charge in the portion between adjacent active trenches. It is believed that the E-fields between the active trenches may primarily be a one dimension (1D) field that spreads primarily laterally, such as in the X direction for example, between the active trenches. However, it is believed that charge balance may be complicated in the portion of the drift region where all the active trenches, for example the ends of the active trenches, are terminating to the last termination trench. For example, creating a 2D and/or 3D transition region. In the region between the termination trench and the ends of the active trenches, the electric fields may extend in three dimensions (3D). One dimension may be laterally, for example the X direction. Another dimension may be axially between the ends of the active trenches and the termination trench, such as the Y direction, and possibly also at various angles between the ends of the active trenches and the termination trench. The third dimension may be vertically into the drift region. The three dimensional (3D) electric fields in the transition region of the termination can result in under-depletion and/or over-depletion of the regions which can result in low or unstable breakdown voltages.

The active trenches can terminate to the termination trench by being connected to it or being disconnected from it by a space. However, in some embodiments, both cases (connected or disconnected) independently may form a 2D and/or 3D transition region at the trench ends, which may result in a non-uniform depletion spread and lower BVdss.

Figure 8:
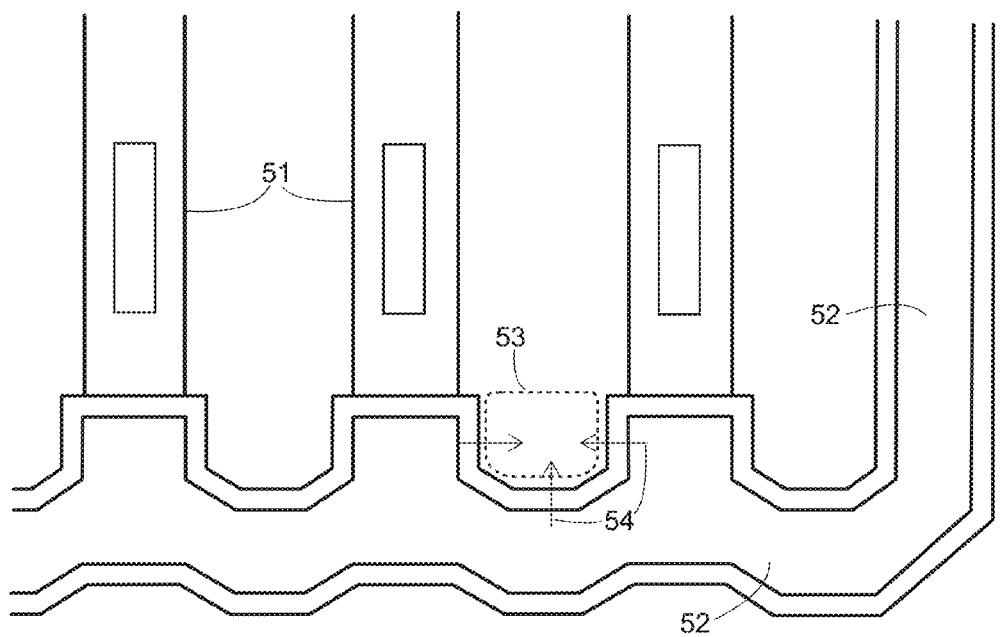
FIG. 8 illustrates an enlarged plan view of one example embodiment of active trenches and a termination trench.

FIG. 8 illustrates an enlarged plan view of one example embodiment of active trenches 51 that are connected to a termination trench 52. One embodiment of a connected transition region 53, illustrated in a general manner by dashed lines, may include a connected transition region that is adjacent to active trenches 51 which are directly connected to termination trench 52. For the example embodiment illustrated in FIG. 8, connected transition region 53 includes the region between trenches 51 where trenches 51 intersect trench 52. In some embodiments region 53 may also include the portion of the drift region along trench 52 between adjacent trenches 51. Another embodiment of region 53 may also include a portion of the drift region extending along the sides of trenches 51 near trench 52. BVDss may be lower, for example, due to over-depletion from the overlapping depletion fronts 54 (illustrated by arrows) in the connected area or in connected transition region 53. Depletion fronts, such as for example fronts 54, include the depletion of charge in the portion of the device that is between active trenches, for example trenches 51 (for example between the sides of adjacent trenches 51), and/or in the portion that is between the active trenches and termination trench 52. The depletion fronts may result from doping(s) in the semiconductor material, such as for example a P-N junction, and/or from potentials applied to the device.

Those skilled in the art will appreciate that trenches 51 may include an active trench structure that includes a conductor that extends vertically, such as into the plane of the page of FIG. 8, into the underlying substrate. The trench structure may include a conductor that has an insulator that insulates the conductor from the substrate. For example, an insulator surrounding a portion of the periphery of the conductor that extends vertically into the device, including the periphery of the bottom of the conductor.

Figure 9:
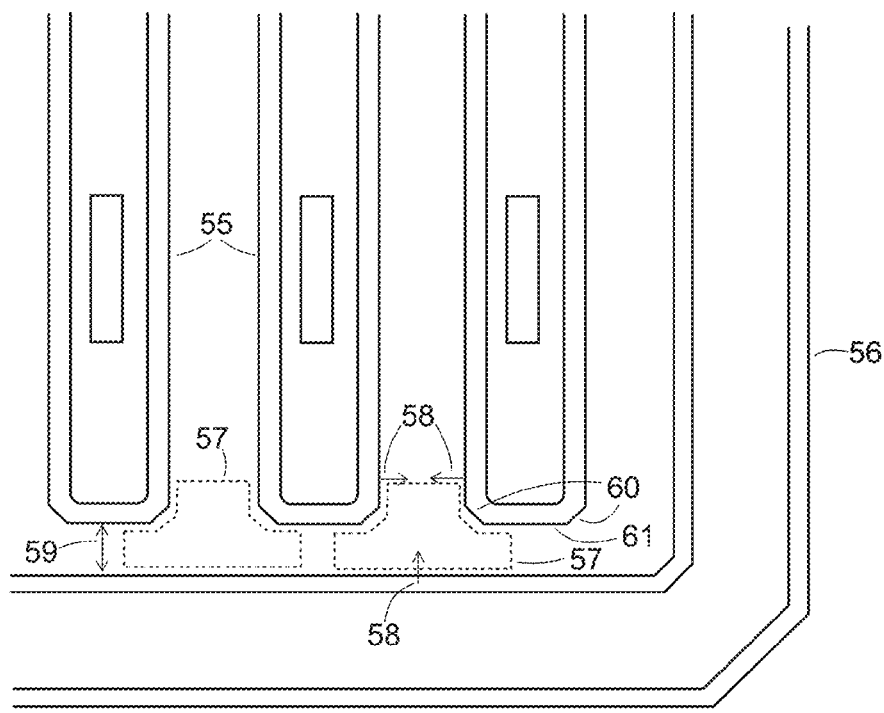
FIG. 9 illustrates one example embodiment of another example embodiment of active trenches and a termination trench.

FIG. 9 illustrates one example embodiment of active trenches 55 that are disconnected to a termination trench 56. One embodiment of a disconnected transition region 57, illustrated in a general manner by dashed lines, may result from active trenches 55 that are disconnected and spaced apart from the termination trench 56. For the example embodiment illustrated in FIG. 9, disconnected transition region 57 includes the region between ends 61 of trenches 55 and adjacent portions of trench 56 and also includes the portions between trench 56 and the corners 60 of trenches 55. BVDss may be lower because of either over-depleted or under-depleted in transition region 57, for example, due to 2D and/or 3D depletion fronts 58 (illustrated by arrows) in region 57. Some of fronts 58 may be formed between the ends of active trenches 55 and trench 56. The depletion fronts, such as for example fronts 58, may include the depletion of charge in the portion of the device that is between the active trenches, for example between trenches 55 (for example between the sides of adjacent trenches 55), and/or the portion of the device that is between the active trenches and the termination trench, such as for example the portion that is between the ends and/or corners of the active trenches (such as corners 60 and ends 61) and trench 56. A disconnection space or distance 59 between the ends of trenches 55 and trench 56 may be either narrower or wider compared to a spacing needed to substantially uniformly deplete transition region 57. Disconnection space 59 may be either narrower or wider compared to the preferred spacing to substantially uniformly deplete transition region 57.

Figure 10:
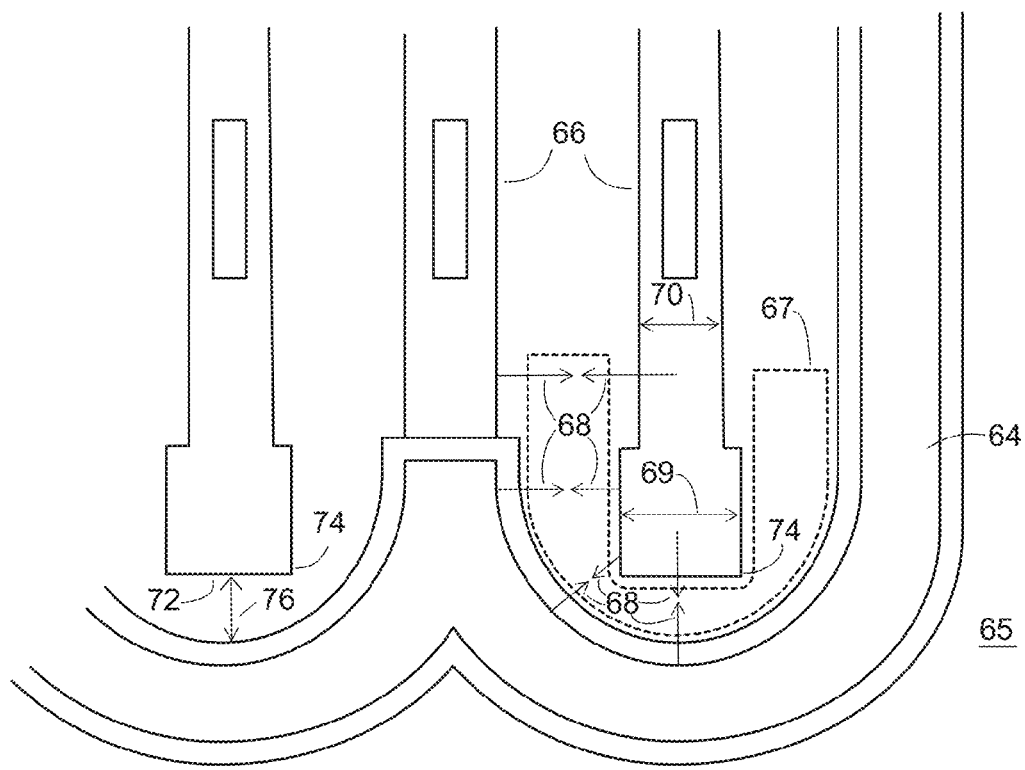
FIG. 10 illustrates an enlarged plan view of an example of a portion of an embodiment of a semiconductor device that includes an improved transition region in accordance with the present invention.

FIG. 10 illustrates an enlarged plan view of an example of a portion of an embodiment of a semiconductor device 65 that includes a non-limiting example embodiment of an improved transition region. An improved transition region may have alternately connected and disconnected active trenches with the termination trench, for example, every alternate active trench may be connected or disconnected to the termination trench. In one embodiment, the active trench ends may be connected to the termination trench in a manner such that a more uniform depletion spread from all the active trenches can take place in the transition region to get improved and higher breakdown voltage. One embodiment may include alternately connecting and disconnecting the active trenches with the termination trench, for example every alternate active trench may be connected or disconnected to the termination trench (see for example FIGS. 10 and 11). One embodiment may include more equal trench spacing between at least two and possibly more adjacent active trenches in all directions between both active and termination for more uniform depletion spread. An embodiment may include same charge balance structure (substantially equal shield-plate spacing) in the active and transition cells or trenches. An embodiment includes that the termination structure, may not have to change for changes in epi doping level. For example, distance 76 between the interior side of trench 64 and end 72 of trench 66 may not have to be adjusted compared to the active cell spacing, if epi doping level is changed. An embodiment includes that distance 76 may be the distance between the conductor of trench 64 and the conductor inside end 72.

An embodiment of device 65 includes active trenches 66 and a termination trench 64. Active trenches 66 are alternately connected and disconnected to termination trench 64. In one embodiment, device 65 may be a shielded gate trench FET that has improved charge balanced and improved BVdss. In one embodiment, improved charge balance may be facilitated by drift region charge that has improved balanced by the depletion from the neighboring active trench and/or neighboring trench shield plates, such as from an adjacent active trench. A transition region 67 includes a portion of device 65, for example a portion of the drift region, that is between termination trench 64 and ends 72 and/or corners 74 of active trenches 66. In some embodiments, region 67 may extend a distance axially or substantially parallel along the side of active trenches 66. In an embodiment, end 72 of trench 66 may have a width 69 that is different from an interior width 70 at a portion of trench 66 that is away from the end, and region 67 may extend along the side of the portion of trench 66 that has width 69 that is different from width 70. 2D and/or 3D depletion fronts 68 (illustrated by arrows) may be formed in region 67.

Figure 11:
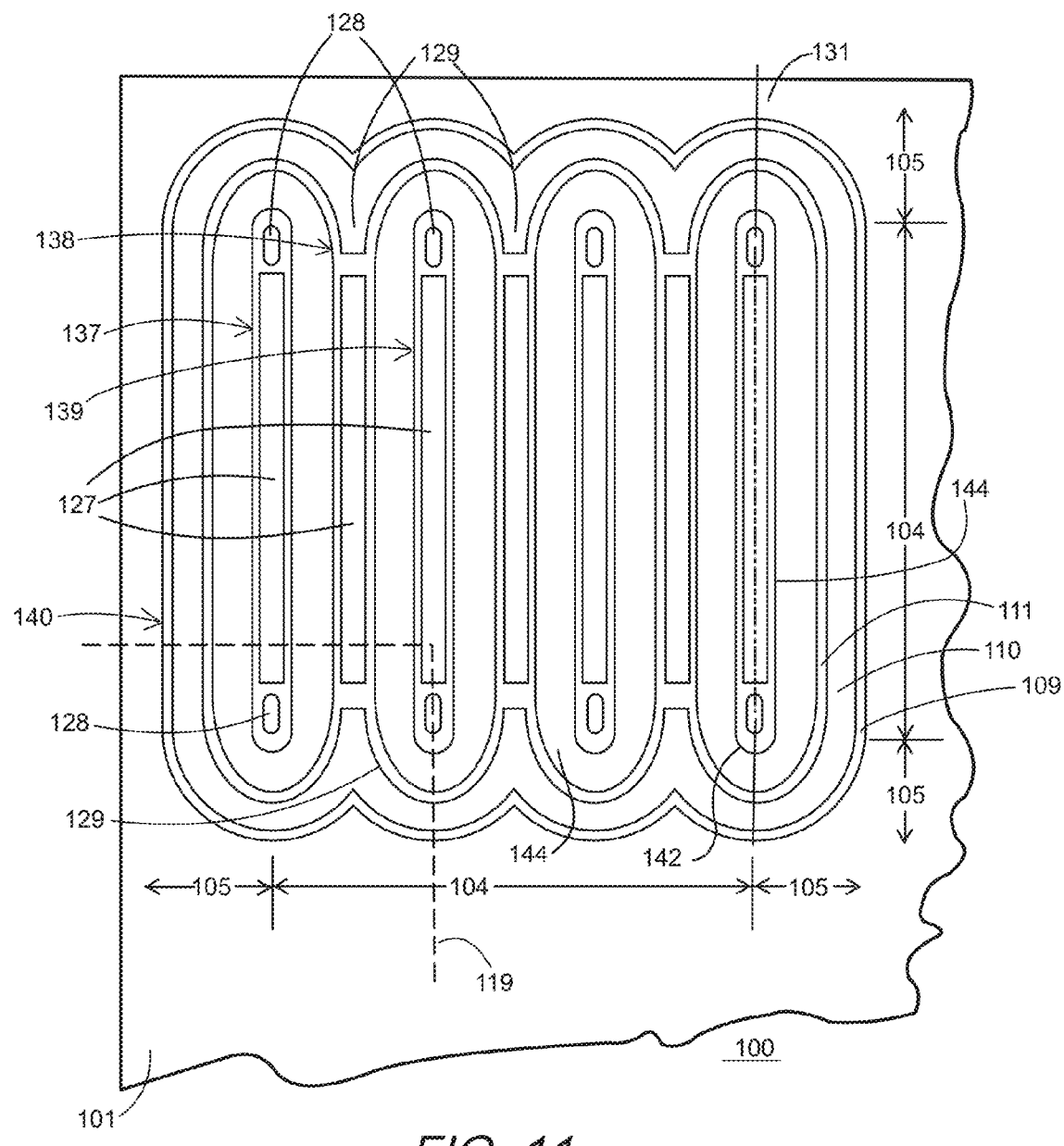
FIG. 11 illustrates an enlarged plan view of an example of a portion of an embodiment of another semiconductor device in accordance with the present invention.

FIG. 11 illustrates an enlarged plan view of an example of a portion of an embodiment of a semiconductor device 100 that is formed on a semiconductor substrate 101. In one embodiment, substrate 101 is a silicon substrate. In some embodiments, device 100 may be similar to device 65 (FIG. 10). Device 100 typically has an active area 104 and an inactive area 105. Active devices including active trenches, such as for example active trenches 137-139, typically are formed in active area 104 and other inactive structures, such as for example a termination trench 140, may be formed in inactive area 105. In one embodiment, device 100 may be a trench MOSFET or vertical trench MOSFET or other type of semi-conductor device that includes active and termination trenches.

Those skilled in the art will appreciate that devices similar to or even different from device 100 may also be formed on substrate 101, and that in most embodiments device 100 occupies only a small portion of a semiconductor wafer that includes substrate 101.

Figure 12:
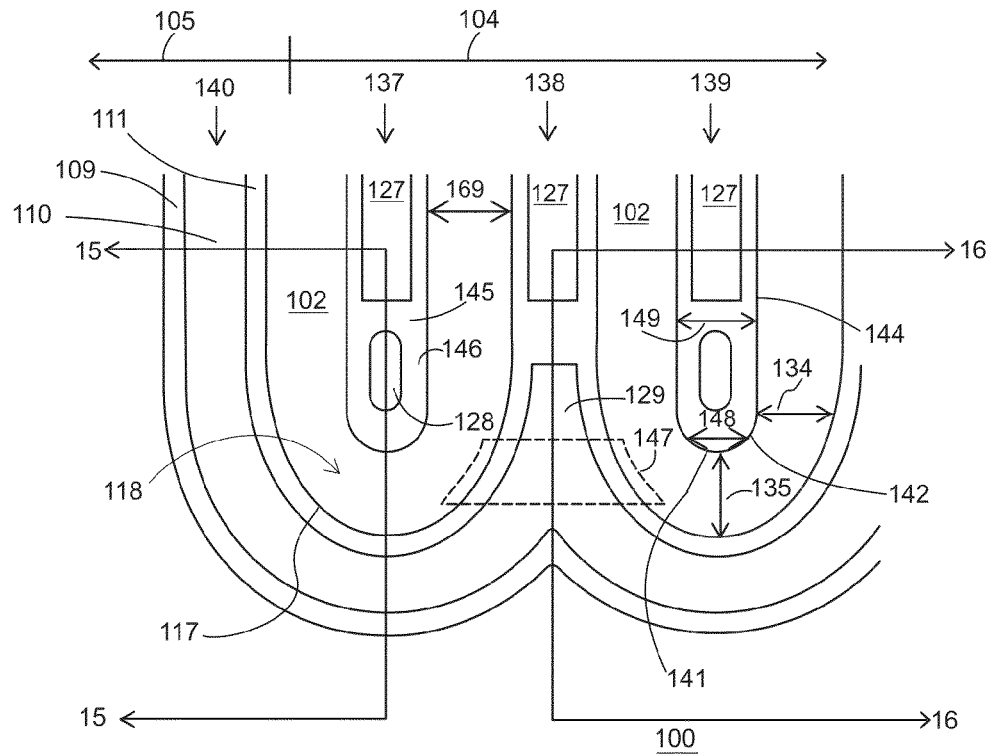
FIG. 12 illustrates an enlarged plan view of a portion of the device of FIG. 11 in accordance with the present invention.

FIG. 12 illustrates an enlarged plan view of a portion of device 100 identified by a dashed box 119 in FIG. 11. This description has references to FIG. 11 and FIG. 12.

Device 100 includes active trenches, such as for example active trenches 137-139, that extend longitudinally a first distance along substrate 101. For example, extend longitudinally in a plane of a top surface of substrate 101. Typically, each active trench may be formed to extend the first distance along a symmetry axis 131 of each active trench. For the example embodiment where device 100 is a MOSFET, each of active trenches 137-139 may include a gate conductor 127 and a field plate or plate conductor 128. An insulator 145 may be positioned between conductors 127 and 128. Insulator 145 may also extend around conductor 127 in most embodiments. In some embodiments, insulator 145 may extend as an insulator 146 around conductor 128. Those skilled in the art will appreciate that in the plan view of device 100, the portion of conductors 127 and 128 that are showing may be only portions of those conductors, such as for example a top surface or a portion, or a contact region of the conductors, and the conductors typically extend into substrate 101 (see for example FIGS. 15 and 16). Active trenches 137-139 typically have ends 141 at distal ends of the trenches and sides 144 that extend along the first distance between ends 141. The active trenches typically also include corners 142 that extend between ends 141 and sides 144. For example, corners 142 may form a linking portion of the active trench or active trench structure that links sides 144 to ends 141. Typically, ends 141 and corners 142 have a profile that includes a non-linear shape such that ends 141 and corners 142 are not formed in a straight line. In some embodiments, at least a portion of ends 141 may have a width 148 that is less than a width 149 of an interior portion of the active trench, such as for example narrower than a longitudinal part of trench 137.

The group of active trenches typically have an outer periphery that surrounds the group of trenches. The outer periphery may have a first portion that extends along the first direction such as in the direction of axis 131 along a first side of the active trenches for example, and may have a second portion that extends along a second direction between ends 141. In most embodiments, the outer periphery may not extend to underlie the group of trenches.

Termination trench 140 may be formed to substantially surround the outer periphery of the active trenches. For example, in FIG. 11, trench 140 surrounds the outer periphery of the group of active trenches 137-139. Trench 140 typically includes a trench conductor 110 that has an insulator 109 and 111 that insulates conductor 110 from substrate 101. Those skilled in the art will appreciate that insulators 109 and 111 typically are portions of one insulator that surrounds conductor 110 and that appears as two different insulators in the illustration (see FIG. 15 for example). Termination trench 140 has a first side that extends along the direction of axis 131 around the outside periphery of the active trenches. Trench 140 also includes a second side that extends along the outer periphery of the active trenches near ends 141 of the active trenches. In one embodiment, the second side of trench 140 may have profile that includes an irregular shape or a non-linear shape such that the second side of trench 140 is not formed in a straight line. In an embodiment, an inner wall or inner edge of the second section may have the non-linear shape and the outer edge may have a straight shape or other shape that is different from the inner edge. An interior edge 117 of the second side of trench 140 typically is positioned a distance 135 from ends 141 and a distance 134 from sides 144 of the active trenches. Exterior edges of active trenches 137-139 may be spaced a distance 169 apart from each other. Distance 169 may or may not be the same as distance 134. A portion of material 102 of substrate 101 typically is positioned between some of ends 141 and trench 140 and may function as a portion of the drift region of device 100. In most embodiments, portion 102 also extends between the active trenches and may form another portion of the drift region of device 100. In an embodiment, distance 135 is the distance between conductor 110 and the end of conductor 128. In other embodiments, distance 135 may be the distance between insulators 111 and 146.

In one embodiment, the second side of trench 140 includes pockets 118 that have a shape that provides a substantially constant value for distance 135 between ends 141 and interior edge 117 and between corners 142 and interior edge 117. In an embodiment, trench 140 includes a first section having pockets 118 having a scalloped or semicircular or angular shape so that interior edge 117 has almost a substantially constant distance between corners 142 and ends 141 such that the shape forms a substantially constant volume of semiconductor material 102 around ends 141 and corners 142. This substantially constant volume assists in providing a substantially uniform electric field that improves the breakdown voltage during the operation of device 100. In one embodiment, distance 134 is formed to be substantially equal to distance 135. This also assists in providing a more uniform electric field and improved breakdown voltage. An embodiment includes that trench 140 has a pocket 118 for every other or each alternate active trench of trenches 137-139. Another embodiment may include that trench 140 has a pocket for every active trench or alternately a pocket 118 for some other number of active trenches. In other embodiments, distances 134 and 135 may be different from each other and distances 135 and 169 may be different from each other as will be seen further hereinafter. An embodiment of trench 140 may also include a second portion or section or an extending portion 147, illustrated in a general manner by a dashed box, that may extend to touch an adjacent active trench, such as trench 138. This extending portion 147 of trench 140 extends into trench 138 such that conductor 110 extends to electrically and physically contact conductor 128 of trench 138 which results in a conductor 129, such as for example a merged conductor. This also assists in forming a substantially constant volume for the semiconductor material 102 surrounding ends 141 and corners 142.

It has been found that forming distances 134 and 135 to form a substantially constant volume between ends 141 and trench 140 and (or alternately) between corners 142 and trench 140 provides a more uniform electric field within at least a portion of the transition region of device 100. For example a more uniform electric field in the semiconductor material 102 around corners 142 and ends 141. It has also been found that forming distances 134 and 135 to be substantially equal to each other (and/or distances 135 and 169 equal to each other) also provides a more uniform electric field within at least a portion of the transition region of device 100, such as for example within at least a portion of semiconductor material 102 around corners 142 and ends 141. It is believed that all of these are unexpected results since one skilled in the art usually understands that a higher electric field exists in corners and that forming a distance around a corner of a structure to be substantially constant (or even to decrease the distance) results in lower breakdown voltages instead of the higher breakdown voltages of device 100.

An embodiment may include that any of trenches 137-139 may be formed in sections instead of one long trench as they are illustrated in FIG. 11. For example, trench 137 may have multiple sections that are spaced in the direction of axis 131, for example along the longitudinal portion of trench 137, instead of being one long continuous active trench. The sections may or may not be abutting each other to make a direct electrical connection between each adjacent section. It may be desirable that the section be close enough together to have overlapping depletion regions.

Figure 13:
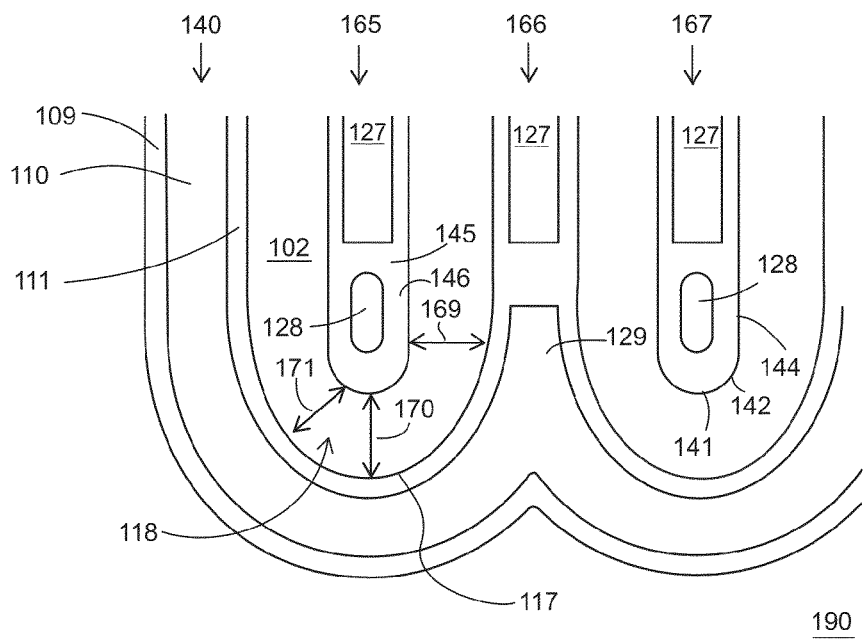
FIG. 13 illustrates an enlarged plan view of an example of a portion of an embodiment of another semiconductor device that includes alternate embodiments portions of the device of FIG. 12 in accordance with the present invention.

FIG. 13 illustrates an enlarged plan view of an example of a portion of an embodiment of a semiconductor device 190 that includes an alternate embodiment of the active and termination trenches of device 100. Device 190 includes active trenches 165-167 that are similar to trenches 137-139 except that trenches 165-167 may include different spacing that those of trenches 137-139. In one embodiment, pockets 118 are formed such that interior edge 117 is closer to ends 141 and corners 142, illustrated in general by a distance 170, than it is to sides 144, illustrated by a distance 169. It has been found that forming distance 170 less than distance 169 and/or less than distance 134 provides a more uniform electric field within at least a portion of the transition region of device 190. For example a more uniform electric field in a portion of semiconductor material 102 from sides 144 around corners 142 and ends 141. In one example embodiment, distance 169 is approximately one and two tenths (1.2) microns and distance 170 is approximately eight tenths (0.8) of a micron. In another embodiment, edge 117 may be formed a third distance 171 from corners 142 that is less than distance 169 but greater than distance 170. Forming corners 142 closer to edge 117 further improves the breakdown voltage of device 100. In another embodiment, distance 171 from corner 142 to edge 117 may vary proportionally along the linking portion of the active trench, such as for example vary with the length from side 144 to end 141. For example, distance 171 may gradually decrease from a value that is substantially equal to distance 169 to a value that is substantially equal to distance 170 according to the distance traveled along the periphery of trench 165 or 167 from side 144 to end 141. In another embodiment, distance 171 may be constant or may vary non-linearly. In another embodiment either one of or both of distances 170 and 171 may be in the range of between approximately fifty percent to seventy five percent (50%-75%) of either of or both of distances 134 or 169.

It is believed that all of these embodiments are unexpected results since one skilled in the art understands that decreasing a distance around a corner of a structure usually results in increased E-field intensity and lower breakdown voltages instead of the higher breakdown voltages of device 190. It is believed that the reduction may result from the 3D interaction of depletion fronts converging from sides and corners of the trench such as for example in the transition region of the trench.

Figure 14:
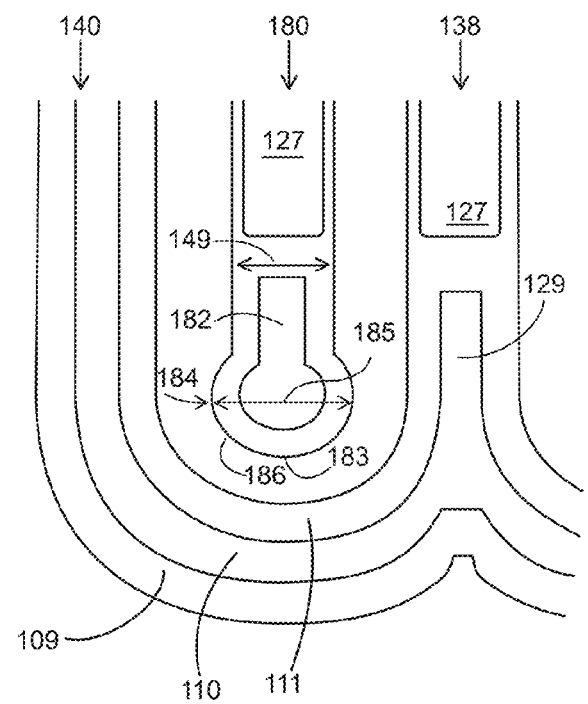
FIG. 14 illustrates an enlarged plan view of an example of another alternate embodiment of an active and termination trenches in accordance with the present invention.

FIG. 14 illustrates an enlarged plan view of another alternate embodiment of an active and termination trench that may be used for device 100 or 190. Some embodiments may include an active trench 180 that is similar to trench 137 but has a tip 184 that is formed in a different shape. Tip 184 may have a profile that includes a non-linear shape such as a bulbous shape where tip 184 has a width 185 that is wider than width 149 of the longitudinal part of trench 180. Tip 184 have a width that is greater than width 149 and in some embodiments may include sides that extend from the side of the longitudinal portion of trench 180 to the corners 186 of tip 184. Corners 186 may also be the corners of trench 180. Alternately, tip 184 may be flared such that the sides extend outward at an angle away from the longitudinal portion. For example, width 185 may increase with increasing distance toward end 183 (see for example FIG. 19). Alternately, tip 184 may have other irregular or non-linear shapes such as a rectangular or diamond shape. These shapes reduce the distance between trench 140 and at least the corners of tip 184 and provides improved breakdown voltage. These shapes also reduce the volume of material between trench 140 and the ends and/or corners of trench 180 which also provides improved breakdown voltage.

It is believed that all of these are unexpected results since one skilled in the art usually believes that decreasing a distance around a corner of a structure results in lower breakdown voltages instead of the higher breakdown voltages of this alternate embodiment of device 100.

Figure 15:
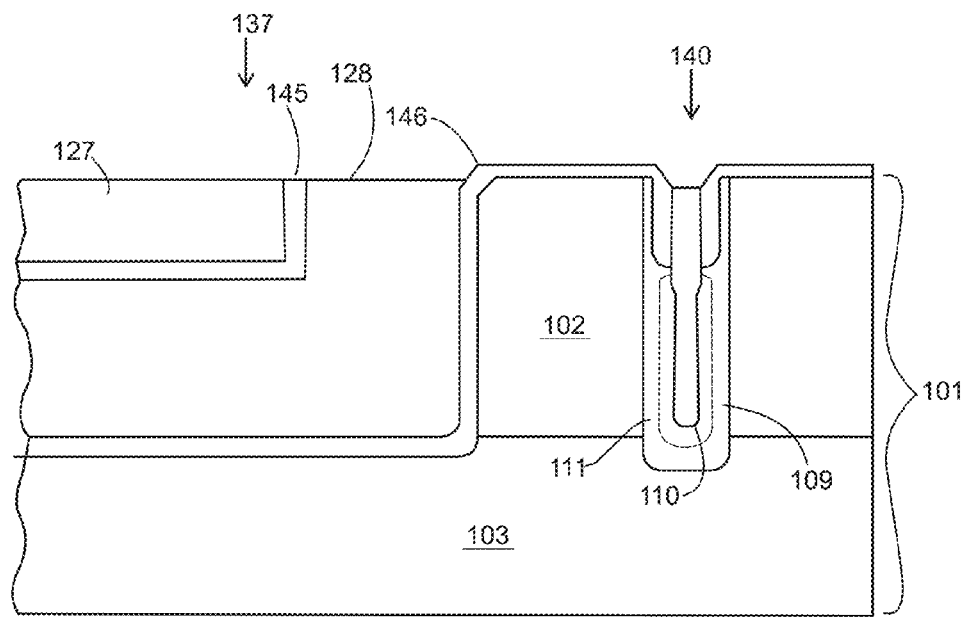
FIG. 15 illustrates an enlarged cross-sectional portion of the device of FIG. 12 in accordance with the present invention.

FIG. 15 illustrates a cross-sectional portion of device 100 along section line 15-15 illustrated in FIG. 12. In some embodiments, substrate 101 may include a bulk semiconductor substrate 103 and in some embodiments may also include other semiconductor layers formed on substrate 103 such as for example an epitaxial layer or other semiconductor layers.

Figure 16:
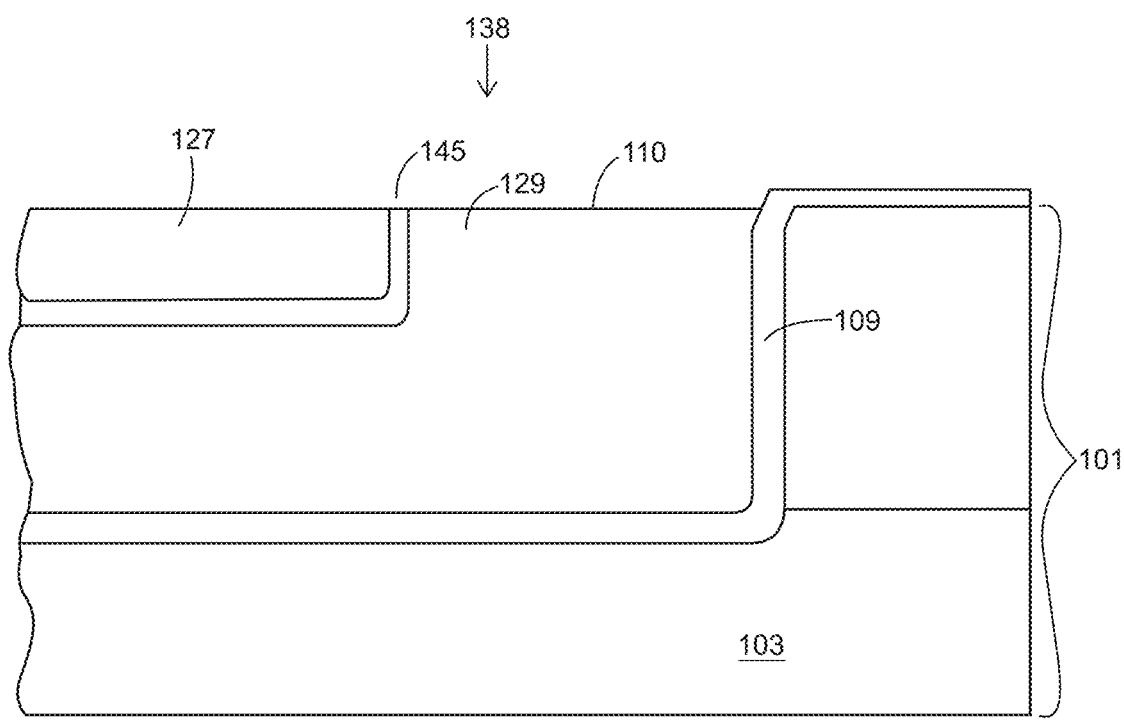
FIG. 16 illustrates another enlarged cross-sectional portion of the device of FIG. 12 in accordance with the present invention.

FIG. 16 illustrates a cross-sectional portion of device 100 along section line 16-16 illustrated in FIG. 12.

Figure 17:
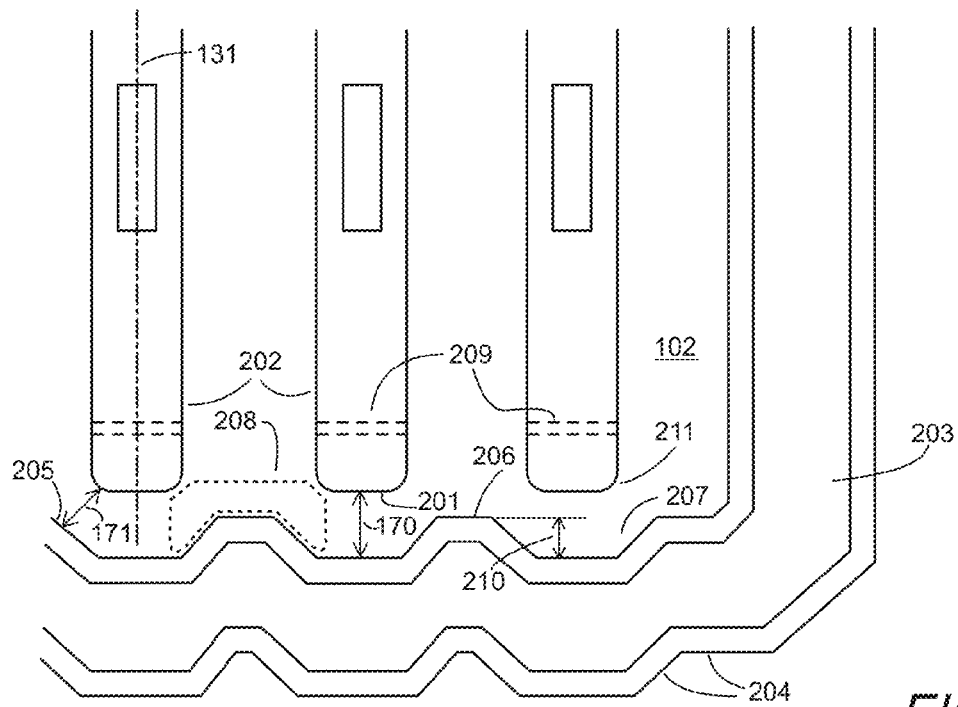
FIG. 17 illustrates an enlarged plan view of an example of a portion of an embodiment of a semiconductor device in accordance with the present invention.

FIG. 17 illustrates an enlarged plan view of an example of a portion of an embodiment of a semiconductor device 200 that is an alternate embodiment of device 65 or 100 or 190. Device 200 includes active trenches 202 and a termination trench 203. Trenches 202 may be similar to trenches 66 and/or 137-139, except that in one embodiment trenches 202 have ends 201 that are substantially straight and in another embodiment may be substantially orthogonal to the sides of trenches 202. An embodiment of termination trench 203 may have profile that includes a non-linear shape. In one embodiment the non-linear shape may include projections 206 in regions between active trenches 202. Another embodiment may include recesses 207 in trench 203 at locations that coincide with ends 201 of trenches 202. Some embodiments may have both projections 206 and recesses 207. Device 200 has a transition region 208 that includes an area that is between two adjacent ends 201 of two adjacent trenches 202. For example, region 208 may extend between two adjacent corners 211 of ends 201. An embodiment may include that region 208 also extends away from trenches 202 to an inside edge 205 of trench 203. For example, extends away from corners 211 toward edge 205. In one embodiment, region 208 extends away from two adjacent ends 201 toward the portion of inside edges 205 that extends between or opposite to the adjacent ends 201, or in one embodiments adjacent corners 211, of the two adjacent trenches 202. In an embodiment, projections 206 extend away from trench 203 into a space that is between two adjacent trenches 202. Projections 206 reduce the spacing between ends 201 and trench 203 which reduces the 2D and/or 3D fields in region 208. In another embodiment, projections 206 may reduce the volume of material 102 that has to be depleted and improves the breakdown voltage of device 200. An embodiment may also include that recesses 207 are positioned opposite to ends 201 of trenches 202. Projections 206 may extend a distance 210 into transition region 208 where distance 210 is the distance between a distal end of a projection and either a recess or a more linear portion of trench 203. An embodiment may include that the non-linear shape of termination trench 203 may include a wavy-shape where part of it has extensions, such as for example projections 206, extending out into transition region 208 to reduce the volume of material 102 and improve depletion in transition region 208. In one embodiment, the wavy shape of trench 203 may include a wavy shape on the outside edge of trench 203, such as forming an outside edge 204 of trench 203 to be similar to an inside edge 205. Such a wavy shape may also assist in maintaining equal trench width for uniform poly filling.

Those skilled in the art will appreciate that trench 203 may also be used as a termination trench of device 65 or 100 or 190.

In an embodiment, inner edge 205 may have the non-linear shape and outer edge 204 may have a straight shape or other shape that is different from inner edge 205. Trenches 202 may optionally include an insulator 209, illustrated in a general manner by dashed lines, between the gate and shield similar to insulator 145 (FIG. 12).

Figure 18:
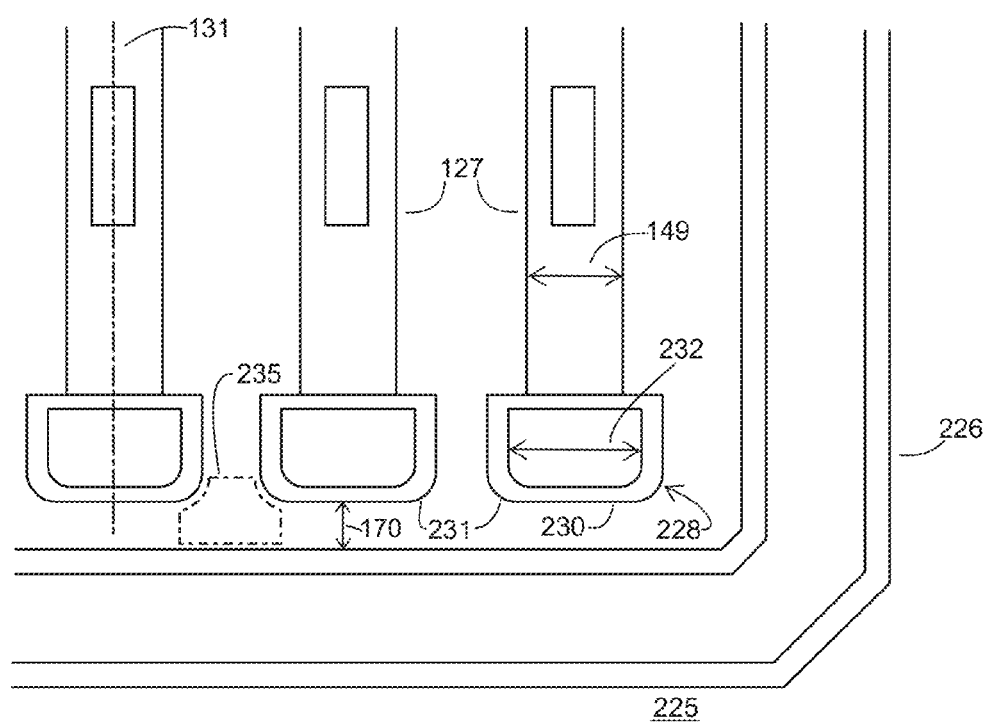
FIG. 18 illustrates an enlarged plan view of an example of a portion of an embodiment of another semiconductor device in accordance with the present invention.

FIG. 18 illustrates an enlarged plan view of an example of a portion of an embodiment of a semiconductor device 225 that is an alternate embodiment of device 65 or 100 or 190 or 200. Device 225 includes a termination trench 226. In one embodiment, trench 226 has substantially straight sides that extend in a direction that is substantially parallel to symmetry axis 131 of trenches 227, and also has substantially straight sides that extend in a direction that is substantially orthogonal to axis 131. An embodiment may include that termination trench 226 has a linear structure but that the active trenches have ends that have a non-uniform or non-linear shape.

An embodiment may include that trenches 227 have a profile that includes a non-linear shape. One embodiment of trenches 227 may include tips 228 that have a width 232 that is greater than width 149 of an interior portion of the active trench, such as for example width 149 of a longitudinal part of trench 227. Tips 228 have an end 230 that is at a distal end of trenches 227. One embodiment may include that ends 230 have rounded corners 231 in the region where ends 230 transition to the sides of tip 228. A transition region 235 includes an area that extends in one direction between two corners 231 of two adjacent tips 228 and extends in another direction from the two tips toward a portion of trench 226 that is between the two tips. The increased width of tips 228 and/or of ends 230 assists in reducing the spacing between adjacent tips 228 and between tips 228 and trench 226 and assist in increasing the breakdown voltage. The increased width of tips 228 and/or ends 230 also assists in reducing the volume of material that has to be depleted thus increasing the breakdown voltage. Additionally, the non-linear shape of the trench end (or trench tip) shapes assist in more uniformly depleting the transition region, for example assist in depleting the 2D transitional region. Those skilled in the art will appreciate that tips 228 may also be used as a portion of trenches 137-139 (FIG. 11) or 180 (FIG. 14) or of trenches 202 (FIG. 17).

Figure 19:
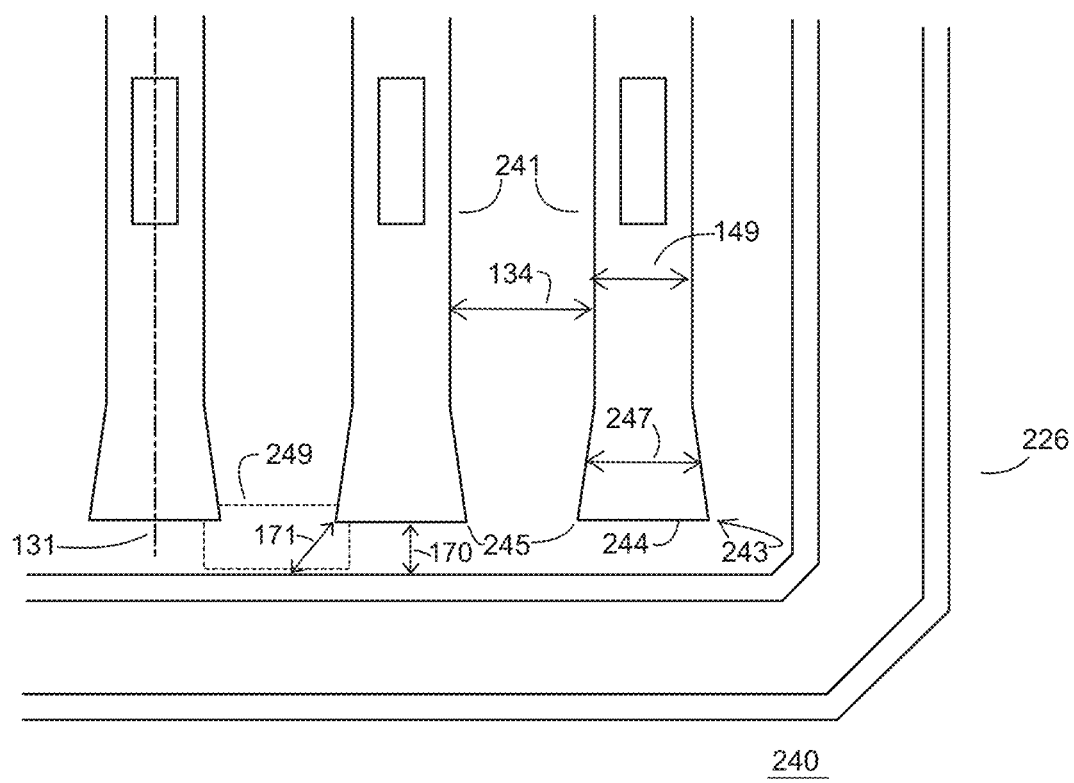
FIG. 19 illustrates an enlarged plan view of an example of a portion of an embodiment of yet another semiconductor device in accordance with the present invention.

FIG. 19 illustrates an enlarged plan view of an example of a portion of an embodiment of a semiconductor device 240 that is an alternate embodiment of device 65 or 100 or 190 or 200 or 225. Device 240 includes termination trench 226. An embodiment may include that active trenches 241 have profile that includes a non-linear shape. One embodiment may include that the profile includes the non-linear shape at least for the tips or ends of trenches 241. An embodiment of the non-linear shape may include that trenches 241 have tips 243 that have a width 247 that is greater than width 149 of an interior portion of the active trench, such as for example wider than a longitudinal part of trench 241. In one embodiment, width 247 increases with increasing distance toward trench 226. For example, width 247 may increase along the sides of tips 243. In another example, with increasing distance away from an intersection of tip 243 with the main portion or interior portion of trench 241. Tips 243 have an end 244 that is at a distal end of trenches 241. One embodiment includes that ends 244 may have corners 245 in the region where ends 244 transition to the sides of tip 243. Corners 245 may be rounded in one embodiment but may be more orthogonal in other embodiments or may have different angles in other embodiments. A transition region 249 includes an area that extends in one direction between two corners 245 of two adjacent tips 243 and extends in another direction from the two corners toward a portion of trench 226 that is between the two corners.

An embodiment may include that ends 244 of trenches 241 have a width that is greater than width 149. The wider width of ends 244 assist in reducing the 2D and 3D fields in transition region 249 and assist in improving the breakdown voltage of device 240. The wider width may also reduce the volume of material that has to be depleted which also assists in increasing the breakdown voltage. In other embodiments, tips 243 and ends 244 may have shapes of flared trench ends, bulb-shaped trench ends, a shape of a partial circle (such as for example more than or less than a semi-circle), square, rectangular, or diamond shaped trench ends. An embodiment may include that the active trench ends/tips are expanded to reduce the 2D silicon transition volume for improved depletion effect. Those skilled in the art will appreciate that tips 243 may also be used as a portion of trenches 137-139 (FIG. 11), of trenches 202 (FIG. 17), or of trenches 227 (FIG. 18).

The embodiments of devices 200, 225, and/or 240 provide improved breakdown voltages. These are an unexpected result for at least the same reasons as explained hereinbefore such as for devices 65, 100 and/or 190.

Those skilled in the art will appreciate that in one embodiment, a semiconductor device may comprise:

a semiconductor substrate having an active region, such as region 104 for example, and an inactive region, such as region 105 for example;

a plurality of active trenches, such as for example trenches 137-139, formed in the active region, a first active trench of the plurality of active trenches having a longitudinal portion, such as a portion extending in the direction along axis 131 for example, extending a first distance in a first direction along an axis and having trench ends, such as for example ends 141 or 201 or 230, at distal ends of the first active trench;

an outer periphery of the plurality of active trenches wherein a first portion of the outer periphery extends along the first direction and a second portion of the outer periphery extends in second direction different from the first direction;

a plate conductor within the first active trench;

a termination trench substantially surrounding the outer periphery of the plurality of active trenches;

a termination conductor within the termination trench;

a longitudinal side, such as for example a side extending along the direction of axis 131, of the termination trench extending in the first direction outside the outer periphery of the plurality of active trenches; and a second side of the termination trench outside the second portion of the outer periphery of the plurality of active trenches, a first section of the second side of the termination trench, for example the section including pocket 118, juxtaposed to a first trench end of the first active trench wherein the first section includes a non-linear shape including one of a scalloped shape or angular shape or projection shape or flared shape or diamond shape, the first section positioned to form a second distance, such as for example distance 135, or 170/171, between an interior edge, such as for example edge 117, of the first section and a first corner of the first trench end of the first active trench, and to form a third distance, such as distance 134 or 169 for example, between one of a longitudinal side of the first active trench and a longitudinal side of an adjacent active trench or between the longitudinal side of the first active trench and the longitudinal side of the termination trench wherein the second distance is substantially one of no greater than or less than the third distance.

Another embodiment may include a second section, such as for example the section that includes side 144, of the second side of the termination trench extending to touch an end of the adjacent active trench of the plurality of active trenches wherein the termination conductor of the termination trench physically and electrically contacts the plate conductor of the adjacent active trench.

Another embodiment may include that the termination conductor physically and electrically contacts the plate conductor of every other active trench of the plurality of active trenches.

In an embodiment, the first trench end of the first active trench may have a shape that is one of a curved shape, a flared end shape, bulb shape, rectangular shape, or diamond shape.

In another embodiment, the second distance between the first trench end of the first active trench and the interior edge of the termination trench may reduce a volume of semiconductor material between the first corner of the first trench end of the first active trench and the interior edge of the termination trench.

An embodiment may include that the second distance is between approximately fifty to seventy five percent of the third distance.

In one embodiment, the semiconductor device may be a trench MOSFET and wherein the first active trench includes a gate conductor within the first active trench and overlying the plate conductor.

One embodiment may include that the termination trench includes a projection extending a fourth distance, such as distance 210 for example, away from the termination trench into a space between the first active trench and an adjacent active trench and spaced away from the trench ends of the first active trench and the adjacent active trench.

An embodiment may include that the first trench end of the first active trench has a width that is greater than a width of the longitudinal portion of the first active trench.

Those skilled in the art will understand that an embodiment of a method of forming a semiconductor device may comprise:

forming the semiconductor device on a silicon semiconductor substrate;

forming a plurality of active trenches in an active region of the semiconductor device including forming longitudinal sides of the plurality of active trenches extending along a first length in a first direction and forming trench ends at a distal ends of the plurality of active trenches wherein the trench ends have a first profile; and forming a termination trench extending around an outer periphery of the plurality of active trenches including forming the termination trench having a second profile along a first side of the termination trench, such as for example a long side of the trench, and forming a third profile along a second side of the termination trench, such as for example a side opposite to the ends of the active trenches, and including forming a varying profile for one of the first profile or the third profile wherein the varying profile forms a first volume of semiconductor material in a first transition region, such as for example transition regions 67, 208, or 235, that is positioned at least between a first corner of a first trench end of a first active trench of the plurality of active trenches and the second side of the termination trench and forms a second volume of semiconductor material that is one of between the first side of the termination trench and a longitudinal side of a first active trench of the plurality of active trenches or between the longitudinal side of the first active trench and a longitudinal side of a second active trench of the plurality of active trenches, wherein the first volume is no greater than the second volume.

Another embodiment of the method may include forming the third profile to include one of a pocket, such as pocket 118 for example, near a first trench end, for example end 141, of the first active trench or a protrusion, such as protrusion 206 for example, that extends from the termination trench toward the first direction into a space between the first active trench and a second active trench of the plurality of active trenches.

An embodiment may include forming an interior edge of the termination trench juxtaposed to the first trench end and forming the interior edge spaced a first distance, such as distance 171 for example, from the first corner and forming a second distance, such as for example distance 134, between the longitudinal side of the first active trench and one of a longitudinal side of a second active trench or first side of the termination trench wherein the first distance is one of no greater than the second distance or less than the second distance.

In an embodiment, the method may include forming the first distance to be between approximately fifty and seventy five percent of the second distance.

The method may also include an embodiment that includes forming the interior edge to include a third distance, for example distance 170, between the first trench end and the interior edge wherein the third distance is greater than the second distance.

An embodiment may include forming a trench tip having a first profile of one of a bulbous shape or a flared shape.

Another embodiment may include forming the first trench end to include a trench tip having a width that is greater than a width of the first active trench along the longitudinal side of the first active trench.

One embodiment may include forming a substantially decreasing volume of semiconductor material that is positioned between the first trench corner and portions of the second side of the termination trench that are adjacent to the trench ends and corners.

In an embodied, the method may include forming a second section of the termination trench extending to touch an end of the second active trench including forming a trench conductor of the termination trench physically and electrically contacting a plate conductor of the second active trench.

Those skilled in the art will also understand that an embodiment of a method of forming a semiconductor device may comprise:

forming a plurality of active trenches with each active trench having a trench end at a distal end of each active trench including forming corners of each active trench linking trench ends to sides of the active trenches wherein each active trench of the plurality of active trenches has a first profile along sides of the active trenches and a second profile at or near the trench ends; and forming a termination trench substantially surrounding an outer periphery of the plurality of active trenches and having a third profile along a first side of the termination trench and a fourth profile along a second side wherein one of the second profile or the fourth profile includes a non-linear shape, such as for example a varying shape of the termination trench and a varying or straight shape of the active trench(s); or straight shape of the termination trench and a varying shape of the active trench(es).

Another embodiment may include forming the fourth profile to have a substantially linear shape and forming the second profile to have a non-linear shape including forming a first active trench of the plurality of active trenches having a first trench end with a width that is wider than a width of a longitudinal portion of the first active trench.

In another embodiment, the method may include forming the second profile to have a non-linear shape including forming the first active trench end to have a shape that is one of an angular shape, a bulbous shape, a flared shape, or diamond shape.

An embodiment may include forming the fourth profile to have a first non-linear shape that includes one of pockets or projections, for example a projection 206, and forming a first corner of a first active trench of the plurality of active trenches spaced a first distance from the non-linear shape and forming a longitudinal side of the first active trench spaced a second distance from one of the first side of the termination trench or a longitudinal side of a second active trench of the plurality of active trenches wherein the first distance is no greater than the second distance; and forming the second profile to have a second non-linear shape.

Another embodiment may include forming the first distance approximately between fifty to seventy five percent of the second distance.

Those skilled in the art will appreciate that a semiconductor device may include termination trenches that are equal spaced to active along a trench length and with a straight profile along the active trench length but with a varying profile at the active trench ends. The semiconductor device may have a similar profile on an exterior of the termination trench to minimize poly fill requirements. The semiconductor device may have active trench ends/tips that are expanded to reduce the 2D silicon transition volume for improved depletion.

An embodiment may include that a semiconductor device may include a termination trench with a linear or substantially straight sides near the active trench ends and may have active trench ends/tips that are expanded to reduce the 2D transition volume for improved depletion, and termination trenches with a varying profile at the active trench ends.

Other trench end shapes, such as for example, flared trench ends, bulb-shaped trench ends, square/rectangular/diamond shaped trench ends may be used to optimize the 2D transition region.

In one embodiment, an improved termination design may have an improved transition region where active trenches are terminating, such as terminating electric fields for example, to the termination trench. The embodiments of device 100 and other devices herein include structures to assist in depleting the transition region of the device for higher, and robust BVDss, such as for example for voltage nodes ranging from approximately forty to two hundred volts (40-200V).

Those skilled in the art will appreciate that one embodiment of a semiconductor device may comprise:

a semiconductor substrate having an active region and an inactive region;

a plurality of active trenches formed in the active region, a first active trench of the plurality of active trenches extending a first distance in a first direction along an axis, such as for example a long axis such as for example axis 131, and having corners, such as for example corners 74 or 142, or 211, or 231, or 245, at distal ends of the first active trench, the first active trench of the plurality of active trenches extending a second distance into the semiconductor substrate, the plurality of active trenches having an outer periphery wherein a first portion of the outer periphery extends along the first direction and a second portion of the outer periphery extends in second direction different from the first direction;

a plate conductor, such as for example conductor 128, within the active trench;

a termination trench substantially surrounding the outer periphery of the plurality of active trenches and extending into the semiconductor substrate;

a termination conductor, such as for example conductor 110, within the termination trench;

a first side of the termination trench extending in the first direction along the outer periphery of the plurality of active trenches;

a second side of the termination trench near the second portion of the outer periphery (or alternately outside the second portion of the outer periphery) of the plurality of active trenches, a first section of the second side of the termination trench, for example the section that includes pocket 118, having a pocket near or at the axis of the first active trench wherein the pocket has a non-linear shape including one of a scalloped shape or circular shape or angular shape or flared shape or diamond shape, the pocket forming a first spacing, such for example distance 135 or 170 or 171, between an interior edge of the pocket the end and corners of the first active trench and a second spacing, such as distance 134, between one of a longitudinal side of the first active trench and an adjacent active trench or between the longitudinal side of the first active trench and a longitudinal side of the termination trench wherein the second distance is no less than the first distance;

a second section of the second side of the termination trench, such as a section illustrated by portion 147, extending to touch an end of the adjacent active trench of the plurality of active trenches wherein the termination conductor of the termination trench physically and electrically contacts the plate conductor of the adjacent active trench.

Another embodiment may include that the second portion of the outer periphery of the plurality of active trenches has a shape that is not a straight line.

In another embodiment, the termination trench may surround the outer periphery of the plurality of active trenches.

An embodiment may include that the termination conductor physically and electrically contacts the plate conductor of every other active trench of the plurality of active trenches.

In another embodiment, the second space may be greater than the first space.

An embodiment may include that the end of the first active trench has a shape that is one of a flared end shape, bulb shape, rectangular shape, or diamond shape.

Another embodiment may include that the space between the end of the first active trench and the interior portion of the termination trench reduces a volume of semiconductor material between the end of the first active trench and the interior portion of the termination trench.

An embodiment may include that the semiconductor device is a trench MOSFET and that the first active trench may include a gate conductor, such as for example conductor 127, within the first active trench and overlying the plate conductor.

Those skilled in the art will appreciate that an embodiment of a semiconductor device may comprise:

active trenches extending along a first length in first direction and having trench ends, such as for example ends 141, or 183, or 201, or 230, or 244, at the distal ends of the active trenches wherein the active trenches have a substantially straight profile along the first length and a non-linear or varying profile at or near the trench ends;

a termination trench having a first profile along a first side and a varying profile along a second side wherein the varying profile includes one of pockets near the trench ends of a first portion of the active trenches or protrusions that extend toward the first direction in a space between the active trenches.

Another embodiment may include that the second side of the termination trench includes recesses that extend away from the trench ends for the portion of the second side that is near the trench ends.

Those skilled in the art will appreciate that an embodiment of a semiconductor device may comprise:

active trenches extending along a first length and first direction and having trench ends at distal ends of the active trenches and having corners, such as for example corners 74 or 142, or 211, or 231, or 245, in a linking region between the trench ends and sides of the active trenches wherein the active trenches have a substantially straight profile along the first length and a non-linear or varying profile at or near the trench ends;

a termination trench having a first profile along a first side and a varying profile along a second side wherein the varying profile forms one of a substantially constant volume or a reduced volume of semiconductor material that is positioned between the trench ends and/or corners and the portions of the second side of the termination trench that are adjacent to the trench ends and corners.

Another embodiment may include that the varying profile of the second side of the termination trench may include a first section that includes a shape that has a non-linear shaped pocket that forms a first space between an interior edge of the pocket and the trench end and corners of a first active trench of the active trenches and a second spacing between one of a longitudinal side of the first active trench and an adjacent active trench or between the longitudinal side of the first active trench and a longitudinal side of the termination trench wherein the second distance is no greater than the first distance.

An embodiment may include that the varying profile of the second side of the termination trench includes a second section extending to touch an end of second active trench of the active trenches that is adjacent the first active trench wherein a field conductor of the termination trench physically and electrically contacts a plate conductor of the second active trench.

Those skilled in the art will appreciate that an embodiment of a semiconductor device may comprise:

active trenches extending along a first length and first direction and having trench ends at the distal ends of the active trenches wherein the active trenches have a substantially straight profile along the first length and a non-linear or varying profile at or near the trench ends;

a termination trench substantially surrounding an outer periphery of the active trenches and having a first profile along a first side and a second profile along a second side wherein the second side in near the trench ends wherein the trench ends have a non-uniform profile.

An embodiment may include that the trench ends have a width that is greater than a width along a central portion or interior portion of the active trenches.

In an embodiment, the trench ends may have a shaped that is one of a flared shape, a bulbous shape, a rectangular that has a width that is greater that a width along a central portion of the active trenches, a rectangular width, or a diamond shape.

Another embodiment may include that the trench ends have a shaped that forms a substantially constant distance between the termination trench and the trench end.

Those skilled in the art will appreciate that one embodiment may include forming a trench FET device with substantially uniform termination depletion width or substantially uniform width or distance of the transition region provided by alternately connecting the end of the active trenches to the termination trench and rounding the termination trench at the trench ends to provide more uniform spacing. An embodiment may include a trench FET device with alternately connected trench ends where the non-connected trench end shapes are adjusted to compensate for depletion variation caused by the end of the trench shape. For example, the non-connected trench end shapes may include flared ends, bulb-shaped trench ends, square, rectangular, or diamond shaped trench ends. In one embodiment, a termination trench is continuous around the die edge, but rounded-shaped around the active trench ends to maintain equal spacing, such as for example distance 35 or distance 170.

An embodiment includes that the active trench ends can be spaced from the termination trench to minimize the under-depletion or over-depletion in the transition region to get an improved breakdown voltage. This may be achieved by changing the trench end (or trench tip) shapes so that it can deplete more uniformly the 3D transitional region. An embodiment may include that the termination trench may be wavy-shape, such as for example protruding into the space between the trenches, to reduce the 3D volume of the transition region for improved depletion effect. The wavy-shape may assist reducing the trench width variations along the trench length for poly filling purposes. For example, may assist to keep the trench width substantially equal along the trench length.

Those skilled in the art will appreciate that in one embodiment, a method of forming a semiconductor device may comprise: providing a semiconductor substrate; forming a semiconductor die on the semiconductor substrate; forming a plurality of trenches in an active region of the semiconductor die; forming a plurality of termination trenches in a termination region of the semiconductor die; alternately connecting and disconnecting the active trenches to a termination trench of the plurality of termination trenches, wherein alternate active trenches are connected or disconnected to at least one termination trench of the plurality of termination trenches.

In another embodiment, the method may include forming substantially equal shield-plate spacing in the active cells, and the termination cells.

An embodiment may also include forming transition cells.

One embodiment may include forming substantially equal trench spacing between any adjacent trenches of one of or both of the plurality of active trenches and the plurality of termination trenches.

An embodiment may include forming at least one termination trench of the plurality of termination trenches substantially continuous around an edge of the semiconductor die, but rounded-shaped around the active trench tip to maintain equal spacing.

In an embodiment the method may include forming at least one termination trench of the plurality of termination trenches substantially rounded-shaped around a tip of at least one active trench of the plurality of active trenches.

An embodiment may include forming at least one termination trench of the plurality of termination trenches having a substantially wavy-shape.

Another embodiment may include forming at least one termination trench of the plurality of termination trenches substantially protruding into a space between the trenches.

An embodiment may include forming at least one termination trench of the plurality of termination trenches having ends or tips that are expanded.

An embodiment of the method may include forming at least one termination trench of the plurality of termination trenches having ends or tips that are one of substantially flared, substantially bulb-shaped, substantially square, substantially rectangular, or substantially diamond.

Another embodiment may include forming at least one active trench that is connected to the at least one termination trench and forming at least a second active trench that is not connected the at least one termination trench.

An embodiment may include forming at least one active trench that is connected to a last termination trench of the plurality of termination trenches and forming at least a second active trench that is not connected the last termination trench of the plurality of termination trenches.

Those skilled in the art will appreciate that another embodiment of a method of forming a semiconductor device may comprise: providing a semiconductor substrate having a semiconductor die on the semiconductor substrate; forming a first active area trench on the semiconductor die; forming a termination trench on the semiconductor die; forming a transition region wherein the first active area trench is terminated to the termination trench.

Another embodiment may also include including forming a second active area trench on the semiconductor die wherein the second active area trench is disconnected from the termination trench.

In view of all of the above, it is evident that a novel device and method is disclosed. Included, among other features, is forming a device structure having an active trench that has a spacing from at least corners of the active trench to a termination trench wherein in one embodiment the spacing is no less that a spacing between sides of two adjacent active trenches or a spacing between a side of the active trench and an adjacent side of the termination trench. In some embodiments the spacing between the corner and the termination trench may be no less than, and in some embodiments less than, a spacing between an end of the active trench and the termination trench. The spacing assists in improving the breakdown performance of the device. In other embodiments, the termination trench and/or the active trench may have a shape that at least forms a substantially constant volume, and in some embodiments reduces the volume, between the termination trench and the corners of the active trench compared to the volume between sides of two adjacent active trenches or between a side of the active trench and an adjacent side of the termination trench.

Some embodiments of device 100 and alternates thereto and other devices herein provide structures to form a substantially uniform spacing in the trench ends, such as for example forming substantially uniform spacing between a termination trench and ends or corners of an active trench. The spacings reduce or substantially eliminate 2D and/or 3D fields in the transition region for more uniform depletion spread.

Alternately connecting and disconnecting the active trenches with the termination trench assists in this effort. An embodiment facilitates forming a more equal spacing between any adjacent trenches in all directions both active and termination trench ends for uniform depletion spread.

An embodiment may include a charge balance structure (for example, substantially equal shield-plate spacing) in the active and transition cells.

An advantage is that there may be no need for termination space adjustment, such as for example distance 135 or distance 170, compared to the active cell spacing, if doping level is changed such as in the drift region or for example in the epi layer.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a semiconductor device comprising:
   forming the semiconductor device on a silicon semiconductor substrate;
   forming a plurality of active trenches in an active region of the semiconductor device including forming longitudinal sides of the plurality of active trenches extending along a first length in a first direction and forming trench ends at a distal ends of the plurality of active trenches wherein the trench ends have a first profile; and
   forming a termination trench extending around an outer periphery of the plurality of active trenches including forming the termination trench having a second profile along a first side of the termination trench and forming a third profile along a second side of the termination trench that faces toward one or more trench ends and including forming a varying profile for one of the first profile or the third profile wherein the varying profile forms a first volume of semiconductor material in a first transition region that is positioned at least between a first corner of a first trench end of a first active trench of the plurality of active trenches and the second side of the termination trench, forms a second volume of semiconductor material that is one of between the first side of the termination trench and a longitudinal side of a first active trench of the plurality of active trenches or between the longitudinal side of the first active trench and a longitudinal side of a second active trench of the plurality of active trenches, and forms a third volume between a second corner of the first trench end and the second side of the termination trench, wherein the first volume and the third volume are no greater than the second volume.

2. The method of claim 1 wherein forming the varying profile includes forming the third profile to include one of a pocket near a first trench end of the first active trench or a protrusion that extends from the termination trench toward the first direction into a space between the first active trench and a second active trench of the plurality of active trenches.

3. The method of claim 1 wherein forming the varying profile includes forming an interior edge of the termination trench juxtaposed to the first trench end and forming the interior edge spaced a first distance from the first corner and forming a second distance between the longitudinal side of the first active trench and one of a longitudinal side of a second active trench or first side of the termination trench wherein the first distance is one of no greater than the second distance or less than the second distance.

4. The method of claim 3 further including forming the first distance to be between approximately fifty and seventy five percent of the second distance.

5. The method of claim 1 wherein forming the varying profile includes forming a trench tip having a first profile of one of a bulbous shape, a curved shape, diamond shape, rectangular shape, or a flared shape.

6. The method of claim 1 wherein forming the varying profile includes forming the first trench end to include a trench tip having a width that is greater than a width of the first active trench along the longitudinal side of the first active trench.

7. The method of claim 1 wherein forming the varying profile includes forming a substantially decreasing volume of semiconductor material that is positioned between the first trench corner and portions of the second side of the termination trench that are adjacent to the trench ends and corners.

8. The method of claim 1 wherein forming the termination trench includes forming a second section of the termination trench extending to touch an end of the second active trench including forming a trench conductor of the termination trench physically and electrically contacting a plate conductor of the second active trench.

9. The method of claim 1 further including forming the first profile to be substantially similar to the third profile.

10. A method of forming a semiconductor device comprising:
    forming a plurality of active trenches with each active trench having a trench end at a distal end of each active trench including forming corners of each active trench linking trench ends to sides of the active trenches wherein each active trench of the plurality of active trenches has a first profile along sides and a second profile at or near the trench ends; and
    forming a termination trench substantially surrounding an outer periphery of the plurality of active trenches and having a third profile along a first side of the termination trench and a fourth profile along a second side that faces at least one trench end wherein the second profile—includes a non-linear shape and wherein a distance from a trench end to the termination trench is substantially no greater than a distance from any of the corners to the termination trench.

11. The method of claim 10 wherein forming the plurality of active trenches includes forming a first active trench of the plurality of active trenches having a first trench end with a width that is wider than a width of a longitudinal portion of the first active trench.

12. The method of claim 11 further including forming the first active trench end to have a shape that is one of an angular shape, a curved shape, a rectangular shape, a bulbous shape, a flared shape, or diamond shape.

13. The method of claim 10 wherein forming the termination trench includes forming the fourth profile to have a first non-linear shape that includes one of pockets or projections and forming a first corner of a first active trench of the plurality of active trenches spaced a first distance from the first non-linear shape and forming a longitudinal side of the first active trench spaced a second distance from one of the first side of the termination trench or a longitudinal side of a second active trench of the plurality of active trenches wherein the first distance is no greater than the second distance.

14. The method of claim 10 wherein forming the termination trench includes forming the fourth profile to include one of a pocket near a first trench end of a first active trench of the plurality of active trenches or a protrusion that extends from the termination trench toward the first active trench into a space between the first active trench and a second active trench of the plurality of active trenches.

15. The method of claim 10 further including forming the fourth profile to be substantially similar to the second profile.

\* \* \* \* \*